(12) United States Patent
Mizutani

(10) Patent No.: US 7,315,354 B2
(45) Date of Patent: Jan. 1, 2008

(54) NEAR-FIELD EXPOSURE METHOD AND APPARATUS, NEAR-FIELD EXPOSURE MASK, AND DEVICE MANUFACTURING METHOD

(75) Inventor: Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 10/529,893

(22) PCT Filed: Aug. 6, 2004

(86) PCT No.: PCT/JP2004/011648

§ 371 (c)(1),
(2), (4) Date: Oct. 17, 2005

(87) PCT Pub. No.: WO2005/015311

PCT Pub. Date: Feb. 17, 2005

(65) Prior Publication Data

US 2006/0160036 A1 Jul. 20, 2006

(30) Foreign Application Priority Data

Aug. 8, 2003 (JP) .............................. 2003-290164

(51) Int. Cl.
*G03B 27/64* (2006.01)
(52) U.S. Cl. ...................................................... 355/76
(58) Field of Classification Search ................ 355/76, 355/19, 75, 78; 430/322, 5
See application file for complete search history.

(56) References Cited

U.S. PATENT DOCUMENTS 4,904,557 A * 2/1990 Kubo ........................... 430/56

(Continued)

FOREIGN PATENT DOCUMENTS

EP 1 150 162 A2 10/2001

OTHER PUBLICATIONS

International Search Report mailed Feb. 7, 2005, issued in International Application No. PCT/JP2004/011648.

(Continued)

*Primary Examiner*—Diane I. Lee
*Assistant Examiner*—Chia-how Michael Liu
(74) *Attorney, Agent, or Firm*—Fitzpatrick, Cella, Harper & Scinto

(57) ABSTRACT

A near-field exposure method wherein a pressure difference is applied between a front face and a rear face of an elastically deformable exposure mask to cause deformation of the exposure mask in accordance with a substrate to be exposed, and to cause the exposure mask surface to follow a surface irregularity state of the substrate so that these surfaces closely contact each other, for exposure based on near field light. The method includes setting the pressure difference applied between the front and rear faces of the exposure mask at a predetermined pressure difference corresponding to a surface roughness of the substrate to be exposed. The predetermined pressure difference is set at a pressure difference larger than a minimum pressure P, which is determined to satisfy equation (1) below, in relation to a maximum surface roughness w at a measurement length a of the substrate to be exposed:

$$P = P_m + E\frac{16hw(4h^2 + (7-v)w^2)}{3a^4(1-v)} \quad (1)$$

wherein h is a thickness of a thin-film mask base material, E is Young's modulus, v is Poisson's ratio, and $P_m$ is a pressure difference for roughly contacting a first substrate and a second substrate with each other.

7 Claims, 4 Drawing Sheets

U.S. PATENT DOCUMENTS

| | | | |
|---|---|---|---|
| 6,171,730 B1 * | 1/2001 | Kuroda et al. | 430/5 |
| 6,187,482 B1 | 2/2001 | Kuroda et al. | 430/5 |
| 7,050,144 B2 | 5/2006 | Mizutani et al. | 355/19 |
| 2004/0121245 A1 | 6/2004 | Inao et al. | 430/5 |
| 2005/0063445 A1 | 3/2005 | Mizutani et al. | 372/94 |
| 2005/0064303 A1 | 3/2005 | Yamada et al. | 430/5 |
| 2006/0003236 A1 | 1/2006 | Mizutani et al. | 430/5 |
| 2006/0003269 A1 | 1/2006 | Ito et al. | 430/323 |

OTHER PUBLICATIONS

Written Opinion mailed Feb. 7, 2005, issued in International Application No. PCT/JP2004/011648.

Alkaisi, Maan, M., et al., "Nanolithography in the Evanescent Near Field," *Advanced Materials*, 13, No. 12-13, Jul. 4, 2001, pp. 877-887.

* cited by examiner

NEAR-FIELD EXPOSURE METHOD AND APPARATUS, NEAR-FIELD EXPOSURE MASK, AND DEVICE MANUFACTURING METHOD

TECHNICAL FIELD

This invention relates to a near-field exposure method, a near-field exposure apparatus, a near-field exposure mask, and a device manufacturing method.

PRIOR ART

Increasing capacity of a semiconductor memory and increasing speed and density of a CPU processor have inevitably necessitated further improvements in fineness of microprocessing through optical lithography. Generally, the limit of microprocessing with an optical lithographic apparatus is on an order of the wavelength of a light source used. Thus, the wavelength of a light source used in optical lithographic apparatuses has been shortened more and more, by using a near ultraviolet laser, for example, and a microprocess of a 0.1 μm order is enabled.

While the fineness is being improved in the optical lithography, in order to assure microprocessing of 0.1 μm or narrower, there still remain many unsolved problems such as further shortening of the wavelength of a light source, development of lenses usable in such a wavelength region, and the like.

As one method for solving such a problem, U.S. Pat. No. 6,171,730 proposes a near-field exposure method for performing exposure on the basis of near field light. The method and apparatus disclosed in this U.S. patent is very useful, and it makes a large contribution to the technical field to which the present invention pertains. In this near-field exposure method, an exposure mask being elastically deformable is used, and a pressure difference is applied between the front face and the rear face of the exposure mask to cause deformation thereof with respect to a substrate to be exposed, whereby the mask and the substrate are in close contact with each other, and whereby the substrate is exposed with near field light. More specifically, an elastically deformable exposure mask is supported at a sufficiently close distance to a substrate to be exposed and, in order to cause deformation of the mask, first the pressure in one of the spaces at opposite sides of the mask that faces a light source side is increased, as compared with the pressure in the space that faces the substrate to be exposed. As the pressure difference between the front and rear faces of the exposure mask gradually increases due to the pressure increase, the mask is deformed, and a portion thereof swelling in a convexed shape toward the substrate to be exposed is brought into contact with the substrate. As the deformation grows, the area of engagement with the substrate increases. The pressure is increased until the mask is brought into contact for the entirety of a predetermined exposure region, and the exposure is carried out in a stage in which the mask is in contact for the whole exposure region.

Since the mask is deformed and is gradually brought into contact with the substrate to be exposed, as described above, it is necessary that, even if the substrate to be exposed has a surface irregularity, the mask could be deformed to follow it, and the mask could be in close contact with the entirety of the exposure substrate. The mask should be elastically deformable to the extent that close contact on an order not greater than 100 nm, required for the near field exposure, can be accomplished. In the aforementioned U.S. patent, a mask having a base material made from a silicon nitride thin film having a thickness of 0.1 μm to 100 μm is used.

In the near-field exposure method disclosed in the aforementioned U.S. patent, if the substrate to be exposed has a surface irregularity as described above, it is necessary that the mask is deformed to follow the surface irregularity, and is brought into close contact with the entirety of the substrate. Conventionally, however, it has not yet been made clear that what pressure difference should be applied between the front and rear faces of the exposure mask is an appropriate pressure for obtaining close contact suitable for the near field exposure. Also, an appropriate mask thickness for obtaining close contact suitable to the near field exposure has not yet been made clear.

DISCLOSURE OF THE INVENTION

It is accordingly an object of the present invention to provide a near-field exposure method, a near-field exposure apparatus, a near-field exposure mask and/or a device manufacturing method, by which, for performing near field exposure while deforming an elastically deformable exposure mask in accordance with a substrate to be exposed, the mask can be controlled to follow the surface irregularity of the substrate to be exposed, such that close contact suited to the near field exposure can be attained.

The present invention can provide a near-field exposure method, a near-field exposure apparatus, a near-field exposure mask and a device manufacturing method, arranged to be described below.

Specifically, in accordance with an aspect of the present invention, there is provided a near-field exposure method wherein a pressure difference is applied between a front face and a rear face of an elastically deformable exposure mask to cause deformation of the exposure mask in accordance with a substrate to be exposed, and to cause the exposure mask surface to follow a surface irregularity state of the substrate so that these surfaces are in close contact with each other, for exposure based on near-field light, characterized in that the pressure difference applied between the front and rear faces of the exposure mask is set at a predetermined pressure difference corresponding to a surface roughness of the substrate to be exposed.

In one preferred form of this aspect of the present invention, the predetermined pressure difference is set at a pressure difference larger than a minimum pressure P, which is determined to satisfy equation (1) below, in relation to a maximum surface roughness w at a measurement length a of the substrate to be exposed:

$$P = P_m + E \frac{16hw(4h^2 + (7-v)w^2)}{3a^4(1-v)} \quad (1)$$

wherein h is a thickness of a thin-film mask base material, E is a Young's modulus, v is Poisson's ratio, $P_m$ is a pressure difference for roughly contacting a first substrate and a second substrate with each other.

The predetermined pressure difference may be set at a pressure difference larger than the minimum pressure P only when the surface roughness of the substrate to be exposed is greater than a reachable depth of the near field light.

In accordance with another aspect of the present invention, there is provided a near-field exposure apparatus for performing exposure on the basis of near field light, the apparatus comprising means for holding a thin film mask, a pressure container capable of applying pressure to apply a pressure difference between a front face and a rear face of the thin film mask, control means for controlling the pressure difference, a stage for holding a substrate to be exposed, and a light source, characterized in that the control means is operable to set the pressure difference at a predetermined pressure difference corresponding to a surface roughness of the substrate to be exposed.

In one preferred form of this aspect of the present invention, the control means is operable to set the predetermined pressure difference at a pressure difference larger than a minimum pressure P, which is determined to satisfy equation (1) as set forth above, in relation to a maximum surface roughness w at a measurement length a of the substrate to be exposed.

The predetermined pressure difference can be set at a pressure difference larger than the minimum pressure P only when the surface roughness of the substrate to be exposed is greater than a reachable depth of the near field light.

The exposure apparatus may further comprise measuring means for measuring a surface roughness of the substrate to be exposed.

In accordance with a further aspect of the present invention, there is provided a near-field exposure mask to be used in an exposure process based on near field light, while a pressure difference is applied between a front face and a rear face of an elastically deformable exposure mask, to cause deformation in accordance with a substrate to be exposed and to cause the mask to follow a surface irregularity state of the substrate so that these surfaces are in close contact with each other, wherein the exposure mask comprises a transparent thin-film mask base material and a light blocking film formed thereon, characterized in that the thin-film mask base material has a predetermined thickness determined on the basis of a surface roughness of the substrate to be exposed and a pressure difference to be applied between the front and rear faces of the mask during the exposure.

In one preferred form of this aspect of the present invention, the predetermined thickness is set at a thickness less than a maximum film thickness determined to satisfy equations (2a) and (2b) below:

$$w(a, h, \Delta P) = \frac{4h^2}{7-v} \frac{1}{[R(a, h, \Delta P)]^{1/3}} + \frac{[R(a, h, \Delta P)]^{1/3}}{3} \quad (2a)$$

$$R(a, h, \Delta P) = \frac{1-v}{7-v} \frac{81a^4 \Delta P}{32hE} + \sqrt{1728h^6 + \left(\frac{1-v}{7-v} \frac{81a^4 \Delta P}{32hE}\right)^2} \quad (2b)$$

wherein h is a thickness of a thin-film mask base material, E is a Young's modulus, v is Poisson's ratio, $\Delta P$ is an applied pressure to be applied after the rough contact, and w is a surface roughness at a measurement length a.

The predetermined thickness may be set at a thickness, which is less than a smallest value of maximum thicknesses determined in accordance with equations (2a) and (2b) mentioned above, with reference to those substrate portions, respectively, in which portions, among largest surface roughnesses at different measurement lengths with respect to the substrate to be exposed, the value of roughness is greater than a reachable distance of the near field light.

In accordance with a yet further aspect of the present invention, there is provided a device manufacturing method, comprising a preparing step for preparing a substrate for device production, an applying step for applying a photosensitive resist for exposure, to the substrate to thereby provide a substrate to be exposed, wherein a pressure difference is applied between a front face and a rear face of an elastically deformable exposure mask to cause deformation of the exposure mask relative to the substrate to be exposed and to cause the exposure mask surface to follow the surface irregularity state of the substrate to be exposed, so that these surfaces are in close contact with each other for exposure based on near field light, and wherein the pressure difference to be applied between the front and rear faces of the exposure mask for the exposure is set at a predetermined pressure difference corresponding to a surface roughness of the substrate to be exposed, a developing and etching step for performing development and etching to the substrate having been exposed, and a process step for performing a predetermined process to the substrate in accordance with a device to be produced, whereby a device is produced.

In accordance with the present invention, it is possible to provide a near-field exposure method, a near-field exposure apparatus, and a near-field exposure mask by which, when an elastically deformable exposure mask is deformed relative to a substrate to be exposed, for near field exposure, the mask can follow the surface irregularity of the substrate to be exposed, so that close contact of them suitable to the near field exposure can be accomplished. Therefore, a resist pattern can be formed very precisely and with a good reproducibility.

These and other objects, features and advantages of the present invention will become more apparent upon a consideration of the following description of the preferred embodiments of the present invention taken in conjunction with the accompanying drawings.

BEST MODE FOR CARRYING OUT THE INVENTION

Preferred embodiments of the present invention will now be described with reference to the attached drawings. Specifically, a description will be made of first, second and third embodiments of the present invention, wherein, for causing an exposure mask to follow the surface irregularity of a substrate to be exposed to thereby obtain close contact of them suited to the near field exposure, the pressure difference to be applied between the front and rear faces of the mask is set at a pressure difference corresponding to the surface roughness of the substrate to be exposed in the first and second embodiments, while an appropriate mask thickness is set for obtaining close contact suited to the near field exposure in the third embodiment.

First Embodiment

Figure 1:
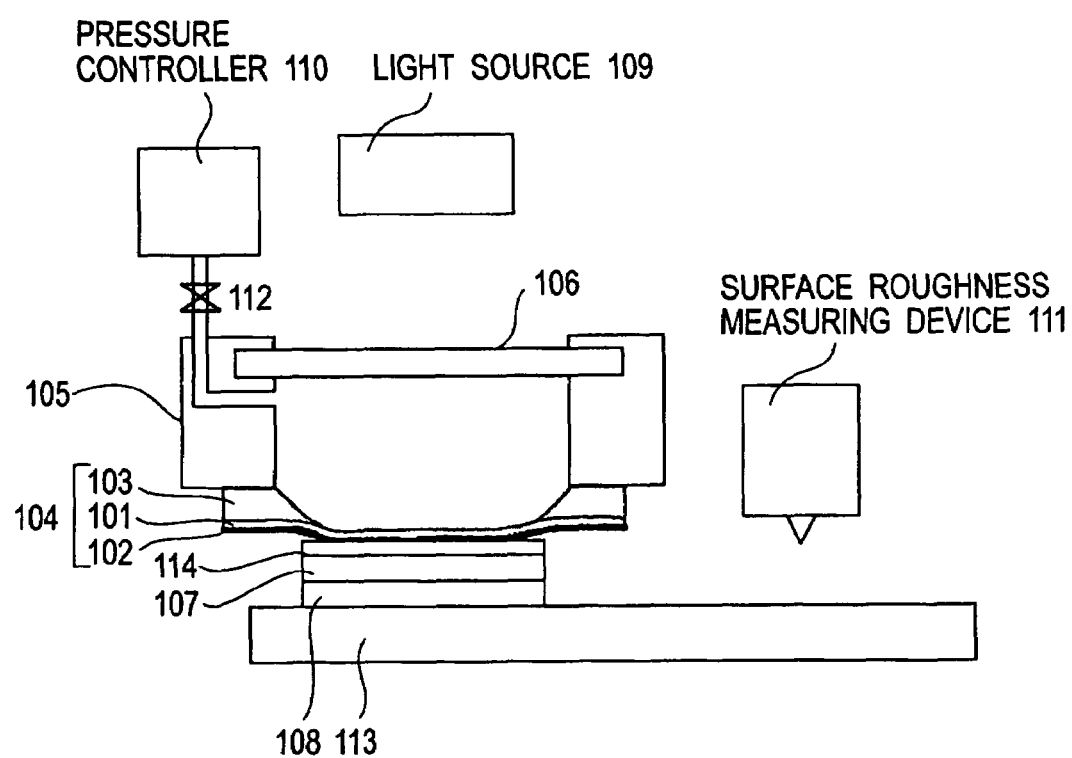
FIG. 1 is a schematic and diagrammatic view of a general structure of a near-field exposure apparatus, for explaining a first embodiment of the present invention.

FIG. 1 illustrates the structure of a near-field exposure apparatus, for explaining a first embodiment of the present invention.

In FIG. 1, denoted at 109 is a light source for exposure, and denoted at 104 is a thin film mask, which is elastically deformable. Denoted at 107 is a substrate to be exposed, that is, a silicon wafer having a resist 114 applied thereto.

The thin film mask 104 comprises a base material made from a transparent thin film such as silicon nitride, for example. A metal thin film 102 (light blocking film) is formed on the base material, while being patterned. There is a support member 103 at the peripheral portion of the thin-film base material 101.

In order to produce a pressure difference between the upper and lower faces of the thin-film mask 104, there is a pressure container 105, which is pressure applicable and is closed by a transparent light introducing window 106 and the thin-film mask 104.

The pressure inside the container 105 is controlled by a pressure controller 110, and a valve 12 is provided to close it.

The substrate 107 to be exposed is fixed on a flat wafer holder 108 by attraction, and this wafer holder 108 is fixed on an x-y stage 113. Denoted at 111 is a surface roughness measuring system for measuring surface roughness of the substrate to be exposed. It is operable to measure surface roughness at a predetermined measurement length.

Next, the sequential procedure of analysis for obtaining a predetermined pressure difference corresponding to the surface roughness of the substrate to be exposed, in accordance with this embodiment, will be explained.

First, the stage 108 is moved to place and to stop the wafer at a predetermined position.

Subsequently, by using the pressure controller 10, a positive pressure $P_m$ is applied into the pressure container, to cause the mask to swell, to cause it to approximate the wafer. Here, a roughness, at a measurement length a for the surface roughness is w, is considered.

The mask being deformed by the pressure $P_m$ is lying on a recessed concave portion of the substrate (having a depth w), such that, while the mask is locally in contact with minute convex portions of the substrate, it is not in contact with the whole surface.

Here, such a state is defined as rough contact. As a model simplifying such rough contact, a model in which a circular region having a diameter a is supported at an outer circumference and is planar, while on the other hand, the substrate to be exposed has a central portion being concave from the plane mask surface with a depth w, is used and analysis is done.

From this state, a pressure ΔP is applied to the region of the mask, having a diameter a. If the central portion of the disk having a diameter a displaces by about w, in response to the pressure application, it can be considered that the mask surface has a shape generally following the wafer surface.

Thus, if the pressure ΔP that causes such a displacement can be identified, such a value ΔP itself or a product obtained by multiplying it by a certain safety factor $C_0$ (e.g., 1.5), taking into account the deformation in random shape, may be added to the rough contact pressure $P_m$ and the result may be taken as an applied pressure during the exposure.

In this embodiment, the pressure difference ΔP applying a displacement w, such as described above, was calculated as follows. First, the deformation shape u(r) of the thin film was examined in accordance with a finite element method, and it was confirmed that the shape according to equation (3) below has a good approximation to it. Here, r is the distance from the center of the disk.

$$u(r) = w\frac{a^2 - 4r^2}{a^2} \qquad (3)$$

A bending distortion energy V corresponding to this shape can be expressed by equation (4) below.

$$V = \frac{16\pi D(1+v)w^2}{a^2} \qquad (4)$$

Here, D is the flexural rigidity of the thin film, and it can be defined by equation (5) below.

$$D = \frac{Eh^3}{12(1-v^2)} \qquad (5)$$

Also, as regards the distortion energy $V_1$ due to elongation of the central surface, a calculus of variation was applied and equation (6) below was obtained.

$$V_1 = \frac{2\pi D(7 + 6v - v^2)w^4}{a^2 h^2} \qquad (6)$$

In this manner, by applying the principle of virtual displacement to the distortion energy as represented by $V+V^1$, an equation regarding the flexure is obtainable. Solving this, equation (7a) below was obtained. In this equation, h is the thickness of the thin-film mask base material, E is the Young's modulus, and v is the Poisson's ratio. Alternatively, equation (7b), additionally including a safety factor $C_0$, may be used.

$$\Delta P = E\frac{16hw(4h^2 + (7-v)w^2)}{3a^4(1-v)} \qquad (7a)$$

$$\Delta P = C_0 E\frac{16hw(4h^2 + (7-v)w^2)}{3a^4(1-v)} \qquad (7b)$$

The pressure $P_m$ for approximating the mask and the wafer to each other also depends on the thickness of the base material and the material constant and, furthermore, it depends on the mask-to-wafer distance before the pressure application. While this quantity can be derived by calculation, the approximating action of the mask and the wafer may be monitored and, on that occasion, the quantity can be acquired at once. The pressure difference ΔP obtained from equation (3) is added to pressure $P_m$ having been determined in accordance with any one of the above-described methods, and the result is taken as a lower-limit set value $P_{low}$ for the pressure to be applied to the mask. By applying a pressure not lower than the lower-limit set value $P_{low}$, the distance between the mask and the wafer can be reduced and a good close-contact state can be accomplished.

Here, the large surface roughness corresponds to the difference between a maximum point of displacement and a minimum point of displacement from a reference line within a measurement length. This is a quantity which depends on the measurement length, and also it is a statistical value which varies with wafers.

Figure 2:
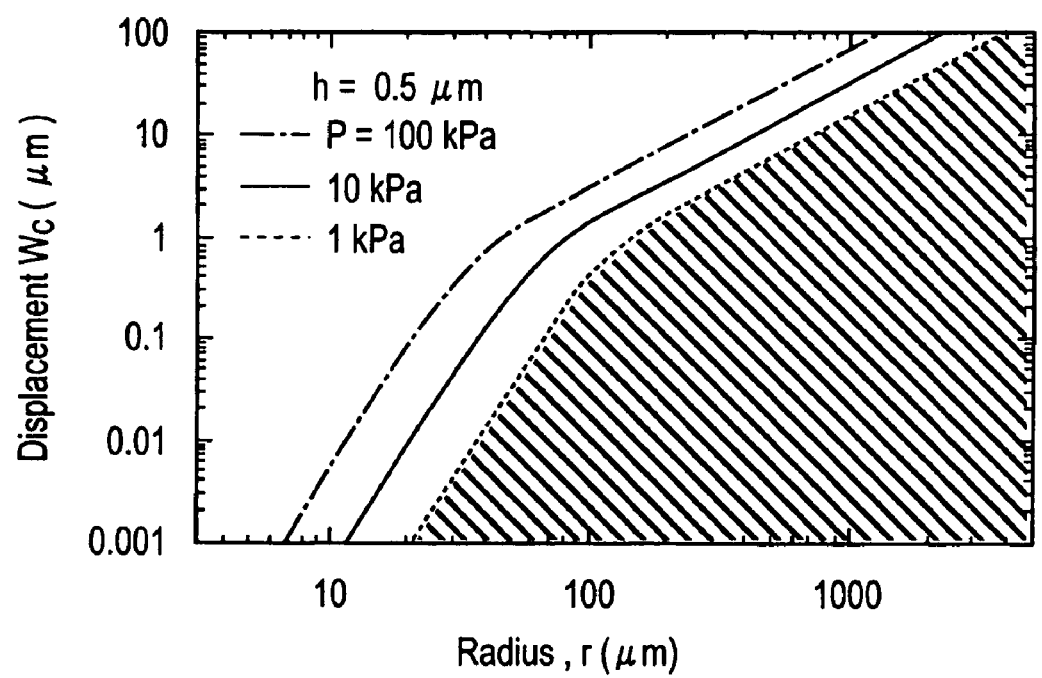
FIG. 2 is a graph for explaining the relation between mask displacement $w_c$ and a disk diameter a when an applied pressure is taken as a parameter in the first embodiment of the present invention.

On the other hand, the displacement amount w of the mask due to the pressure application is also a quantity that depends on the diameter of the disk considered here, that is, the measurement length for roughness. Since each of these quantities comprises a set of a plurality of quantities, a comparison using a graph such as shown in FIG. 2, and to be described below, may effectively be made to choose ΔP.

First, equations (7a) and (7b) are solved with respect to w, and equations (8a) and (8b) are obtained. Equation (8b) is used for R(a, h, P) in equation (8a). By using this, as shown in FIG. 2, the displacement amount w at the mask center is plotted with reference to the diameter a of the model disk. FIG. 2 illustrates a calculation example with respect to a silicon nitride film having a thickness of 0.5 nm.

$$w_c(a, h, P) = \frac{4h^2}{7-v} \frac{1}{[R(a, h, P)]^{1/3}} + \frac{[R(a, h, P)]^{1/3}}{3} \quad (8a)$$

$$R(a, h, P) = \frac{1-v}{7-v} \frac{81a^4 P}{32hE} + \sqrt{1728h^6 + \left(\frac{1-v}{7-v} \frac{81a^4 P}{32hE}\right)^2} \quad (8b)$$

From the foregoing description, it is seen that, if the largest roughness w+3σ (σ is the standard deviation of the roughness) at respective measurement lengths under an applied pressure ΔP is smaller than $w_c$ (a, h, ΔP), the mask and the wafer can follow each other.

Further, where values of surface roughness obtained with different measurement lengths are plotted in the same figure and, if all of them are included in a meshed region, then it is seen that the mask and the wafer can be brought into good contact with each other.

Although the near field light depends on the pattern of opening, since it can reach up to a region of tens of nanometers, near field exposure can be carried out to a surface irregularity not larger than 10 nm, for example, without a substantial influence. In consideration of this, the surface roughness measurement length a is made shorter and shorter and, if there is a length with which the largest surface roughness becomes not greater than 10 nm, then the surface roughness in a region narrower than that length can be disregarded, since it does not substantially and adversely affect the near field exposure.

In this embodiment, the pressure controller 110 is controlled to apply a pressure difference, determined in the manner described above, between the front and rear faces of the thin-film mask. Then, the valve 112 is closed to hold the pressure. Light from the light source 109 is then projected onto the thin-film mask 104 through the introducing window 106, whereby the resist film on the wafer 107 is exposed.

In accordance with this embodiment, wherein a pressure difference such as described above is applied and near field exposure is carried out on the basis of it, the mask can be deformed to follow the wafer in accordance with a pressure corresponding to the surface roughness of the wafer. As a result, a resist pattern can be produced with good precision. Further, since it is no longer necessary to apply an unnecessarily large pressure difference to the mask, unnecessary deformation of the mask can be avoided, and distortion of a pattern to be transferred can be reduced. Thus, high pattern reproducibility can be attained.

Furthermore, in addition to the exposure process described in this embodiment, a developing and etching process may be done to the exposed substrate and, thereafter, a predetermined process or processes corresponding to devices to be produced on a silicon wafer, for example, may be performed, whereby devices, such as semiconductor devices, optical devices, or quantum devices, for example, can be manufactured.

Second Embodiment

Figure 3:
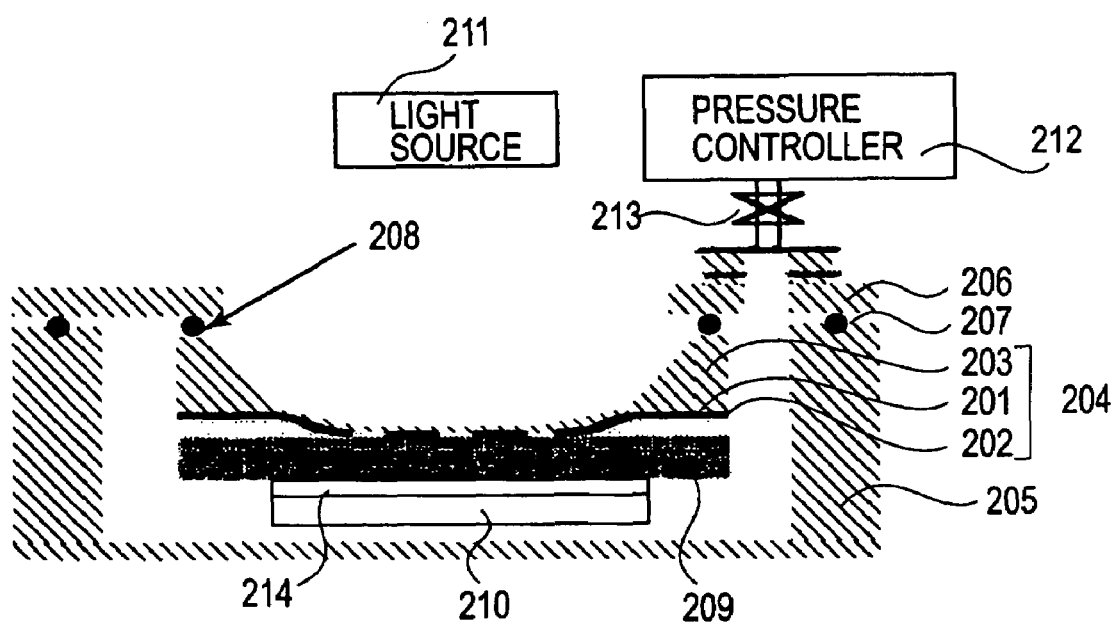
FIG. 3 is a schematic view of a general structure of a near-field exposure apparatus, for explaining a second embodiment of the present invention.

FIG. 3 shows the structure of an exposure apparatus according to a second embodiment of the present invention.

In FIG. 3, denoted at 211 is a light source for exposure, and denoted at 204 is a thin film mask, which is elastically deformable. Denoted at 209 is a substrate to be exposed, that is, a silicon wafer having a resist applied thereto.

The thin film mask 204 comprises a base material 201 made from a transparent thin film such as silicon nitride, for example. A metal thin film 202 (light blocking film) is formed on the base material, while being patterned. There is a support member 203 at the peripheral portion of the thin-film base material 201.

In order to produce a pressure difference between the upper and lower faces of the thin-film mask 204, the thin-film mask 204 and a pressure container 205, as well as a container cover 206, are assembled by use of O-rings 207 and 208. Inside of the container is a closed space, which is pressure applicable, and the inside pressure of the container is controlled by a pressure controller 212, and a valve 213 is provided to close it.

The substrate 209 to be exposed is fixed, by attraction, on a flat wafer holder 108, which is mounted on an x-y stage 210. The stage 210 is moved to place and stop the wafer at a predetermined position. Then, by using the pressure controller 212, the inside pressure of the pressure container is reduced to cause the thin-film mask 204 to swell, to cause it to approximate the wafer shape.

By controlling the pressure controller 212, a pressure difference corresponding to the surface roughness of the mask is applied between the front and rear faces of the mask, in a similar manner as that in the first embodiment, and then the valve 213 is closed to hold the pressure. In this state, light from the light source 211 is projected onto the thin-film mask 204, whereby the resist film on the wafer 209 is exposed.

In accordance with this embodiment, wherein a pressure difference such as described above is applied and near field exposure is carried out on the basis of it, the mask can be deformed to follow the wafer in accordance with a pressure corresponding to the surface roughness of the wafer. As a result, a resist pattern can be produced with good precision. Further, since it is no longer necessary to apply an unnecessarily large pressure difference to the mask, unnecessary deformation of the mask can be avoided and distortion of a pattern to be transferred can be reduced. Thus, high pattern reproducibility can be attained.

Third Embodiment

In accordance with a third embodiment of the present invention, the thickness of a near-field mask is set at a thickness appropriate for obtaining close contact suited to the near field exposure, on the basis of the surface roughness of the substrate to be exposed and of the pressure difference to be applied between the front and rear faces of the mask during the exposure.

Once the surface roughness of the substrate to be exposed, to be used for near field exposure, as well as the pressure ΔP to be applied for the close contact, are determined, the film thickness of the thin-film mask base material corresponding to them can be designed, in the manner to be described below.

Figure 4:
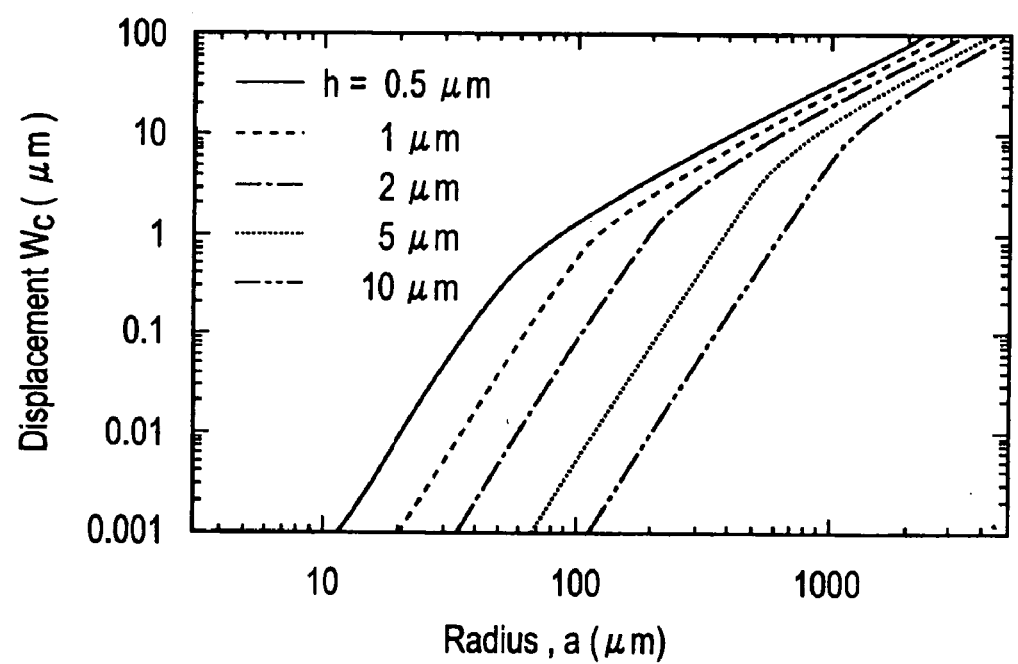
FIG. 4 is a graph for explaining the relation between mask displacement $w_c$ and a disk diameter a in which a film thickness is taken as a parameter in a third embodiment of the present invention.

FIG. 4 illustrates the relationship between the mask displacement amount $w_c$ and the diameter a of the model disk, wherein the mask displacement amount $w_c$ is plotted with reference to the disk diameter a. The parameter in this example is the film thickness of the thin-film mask base material. The pressure was 10 kPa. FIG. 4 is an example of a calculation to a silicon nitride film, using equations (8a) and (8b) described with reference to the first embodiment.

If the largest roughness w+3σ (σ is the standard deviation of the roughness) at respective measurement lengths are less than $w_c$ (a, h, ΔP), the mask and the wafer can follow each other. The value of roughness corresponding to various measurement lengths are plotted in FIG. 4, and a curve that passes above all the plotted points is chosen. It is seen that, by using such a film thickness, the mask and the wafer can follow each other in response to the application of a predetermined pressure ΔP. Namely, among aggregations of largest surface roughnesses, each being determined in relation to a few measurement lengths, equations may be referred to with respect to one or those aggregations having a value larger than the reachable length of the near field light, and a smallest value in the aggregation of the largest film thickness is chosen. Then, a film thickness, smaller than the so selected value, may be designed.

Alternatively, if it is predetermined that the surface roughness increases, as compared with the initial state, in the latter half of a process involving plural times of exposure operations, for example, FIG. 4, which is a plot view based on equations (8a) and (8b) may be referred to and the mask thickness to be used in the first half of the process and the mask thickness to be used in the second half of the process may be made different from each other.

INDUSTRIAL APPLICABILITY

According to the present invention, it is possible to provide a near-field exposure method, a near-field exposure apparatus, a near-field exposure mask and/or a device manufacturing method, by which, for performing near field exposure while deforming an elastically deformable exposure mask in accordance with a substrate to be exposed, the mask can be controlled to follow the surface irregularity of the substrate to be exposed, such that close contact suited to the near field exposure can be attained.

While the invention has been described with reference to the structure disclosed herein, it is not confined to the details set forth and this application is intended to cover such modifications or changes as may come within the purposes of the improvements or the scope of the following claims.

This application claims priority from Japanese Patent Application No. 2003-290164, filed Aug. 8, 2003, which is hereby incorporated by reference.

What is claimed is:

1. A near-field exposure method wherein a pressure difference is applied between a front face and a rear face of an elastically deformable exposure mask to cause deformation of the exposure mask in accordance with a substrate to be exposed and to cause the exposure mask surface to follow a surface irregularity state of the substrate so that these surfaces are closely contacted to each other, for exposure based on near field light, said method comprising:

setting the pressure difference applied between the front and rear faces of the exposure mask at a predetermined pressure difference corresponding to a surface roughness of the substrate to be exposed, wherein the predetermined pressure difference is set at a pressure difference larger than a minimum pressure P, which is determined to satisfy equation (1) below, in relation to a maximum surface roughness w at a measurement length a of the substrate to be exposed:

$$P = P_m + E \frac{16hw(4h^2 + (7-v)w^2)}{3a^4(1-v)} \quad (1)$$

wherein h is a thickness of a thin-film mask base material, E is Young's modulus, v is Poisson's ratio, and $P_m$ is a pressure difference for roughly contacting a first substrate and a second substrate with each other.

2. A method according to claim 1, wherein the predetermined pressure difference is set at a pressure difference larger than the minimum pressure P only when the surface roughness of the substrate to be exposed is greater than a reachable depth of the near field light.

3. A near-field exposure apparatus for performing exposure on the basis of near field light, said apparatus comprising means for holding a thin film mask;
a pressure container capable of applying pressure to apply a pressure difference between a front face and rear face of the thin film mask;
control means for controlling the pressure difference;
a stage for holding a substrate to be exposed; and
a light source,
wherein said control means is operable to set the pressure difference at a predetermined pressure difference corresponding to a surface roughness of the substrate to be exposed,
wherein said control means is operable to set the predetermined pressure difference at a pressure difference larger than a minimum pressure P, which is determined to satisfy equation (1) below in relation to a maximum surface roughness w at a measurement length a of the substrate to be exposed, $$P = P_m + E \frac{16hw(4h^2 + (7-v)w^2)}{3a^4(1-v)} \quad (1)$$

wherein h is a thickness of a thin-film mask base material, E is Young's modulus, v is Poisson's ratio, and $P_m$ is a pressure difference for roughly contacting a first substrate and a second substrate with each other.

4. An apparatus according to claim 3, wherein the predetermined pressure difference can be set at a pressure difference larger than the minimum pressure P only when the surface roughness of the substrate to be exposed is greater than a reachable depth of the near field light.

5. An apparatus according to claim 3, further comprising measuring means for measuring a surface roughness of the substrate to be exposed.

6. A near-field exposure mask to be used in an exposure process based on near field light while a pressure difference is applied between a front face and a rear face of an elastically deformable exposure mask to cause deformation in accordance with a substrate to be exposed and to cause the mask to follow a surface irregularity state of the substrate so that these surfaces are closely contacted to each other, said exposure mask comprising:

a transparent thin-film mask base material; and a light blocking film formed therein, wherein the thin-film mask base material has a predetermined thickness determined on the basis of a surface roughness of the substrate to be exposed and a pressure difference to be applied between the front and rear faces of the mask during the exposure, wherein the predetermined thickness is set at a thickness less than a maximum film thickness determined to satisfy equations (2a) and (2b) below:

$$w(a, h, \Delta P) = \frac{4h^2}{7-v} \frac{1}{[R(a, h, \Delta P)]^{1/3}} + \frac{[R(a, h, \Delta P)]^{1/3}}{3} \quad (2a)$$

$$R(a, h, \Delta P) = \frac{1-v}{7-v} \frac{81a^4 \Delta P}{32hE} + \sqrt{1728h^6 + \left(\frac{1-v}{7-v} \frac{81a^4 \Delta P}{32hE}\right)} \quad (2b)$$

wherein h is a thickness of a thin-film mask base material, E is Young's modulus, v is Poisson's ratio, $\Delta P$ is an applied pressure to be applied after the rough contact, and w is a surface roughness at a measurement length a.

7. A near-field exposure mask according to claim 6, wherein the predetermined thickness is set at a thickness, which is less than a smallest value of a maximum thicknesses determined in accordance with equations (2a) and (2b), with reference to those substrate portions, respectively, in which portions, among largest surface roughnesses at different measurement lengths with respect to the substrate to be exposed, the value of roughness is greater than a reachable distance of the near field light.

* * * * *